(12) United States Patent
Kim et al.

(10) Patent No.: US 11,545,451 B2
(45) Date of Patent: Jan. 3, 2023

(54) SEMICONDUCTOR PACKAGE

(71) Applicant: Nepes CO., LTD., Samseong-myeon (KR)

(72) Inventors: Hyun Sik Kim, Daejeon (KR); Seung Hwan Shin, Cheongju-si (KR); Yong Tae Kwon, Cheongju-si (KR); Dong Hoon Seo, Cheongju-si (KR); Hee Cheol Kim, Cheonan-si (KR); Dong Soo Lee, Cheongju-si (KR)

(73) Assignee: NEPES CO., LTD., Samseong-Myeon (KR)

( * ) Notice: Subject to any disclaimer, the term of this patent is extended or adjusted under 35 U.S.C. 154(b) by 0 days.

(21) Appl. No.: 17/179,432

(22) Filed: Feb. 19, 2021

(65) Prior Publication Data
US 2021/0288005 A1 Sep. 16, 2021

(30) Foreign Application Priority Data

Feb. 19, 2020 (KR) .................. 10-2020-0020556
Feb. 19, 2021 (KR) .................. 10-2021-0022404

(51) Int. Cl.
*H01L 23/00* (2006.01)

(52) U.S. Cl.
CPC .............. *H01L 24/02* (2013.01); *H01L 24/05* (2013.01); *H01L 24/11* (2013.01); *H01L 24/13* (2013.01); *H01L 24/16* (2013.01); *H01L 24/73* (2013.01); *H01L 2224/0235* (2013.01); *H01L 2224/02311* (2013.01); *H01L 2224/02331* (2013.01); *H01L 2224/02375* (2013.01); *H01L 2224/02377* (2013.01); *H01L 2224/02381* (2013.01); *H01L 2224/05548* (2013.01); *H01L 2224/05551* (2013.01); *H01L 2224/05555* (2013.01); *H01L 2224/05556* (2013.01); *H01L 2224/11849* (2013.01); *H01L 2224/13007* (2013.01); *H01L 2224/13018* (2013.01); *H01L 2224/1319* (2013.01); *H01L 2224/13024* (2013.01); *H01L 2224/13076* (2013.01); *H01L 2224/13147* (2013.01); *H01L 2224/16227* (2013.01); *H01L 2224/73204* (2013.01)

(58) Field of Classification Search
CPC ........................................ H01L 24/02
See application file for complete search history.

(56) References Cited

U.S. PATENT DOCUMENTS 6,392,163 B1 * 5/2002 Rinne .................. H01L 24/06
361/767
6,546,620 B1 4/2003 Juskey et al.
(Continued)

FOREIGN PATENT DOCUMENTS

KR 100764055 B1 10/2007
KR 20140085359 A 7/2014

*Primary Examiner* — William A Harriston
(74) *Attorney, Agent, or Firm* — Bayramoglu Law Offices LLC

(57) ABSTRACT

A semiconductor package includes a semiconductor chip having at least one chip pad disposed on one surface thereof; a wiring pattern disposed on top of the semiconductor chip and having at least a portion thereof in contact with the chip pad to be electrically connected to the chip pad; and a solder bump disposed on outer surface of the wiring pattern to be electrically connected to the chip pad through the wiring pattern.

20 Claims, 15 Drawing Sheets

(56) References Cited

U.S. PATENT DOCUMENTS

| | | | |
|---|---|---|---|
| 8,035,226 B1 * | 10/2011 | Wilcoxen | H01L 24/13 |
| | | | 257/737 |
| 9,385,100 B1 | 7/2016 | Lee et al. | |
| 10,224,270 B1 | 3/2019 | Darveaux et al. | |
| 2009/0096098 A1 | 4/2009 | Yang et al. | |
| 2016/0093580 A1 * | 3/2016 | Scanlan | H01L 24/02 |
| | | | 438/114 |
| 2016/0141213 A1 | 5/2016 | Bishop et al. | |

* cited by examiner

SEMICONDUCTOR PACKAGE

CROSS-REFERENCE TO RELATED APPLICATIONS

This application claims priority to and the benefit of Korean Patent Application No. 10-2020-0020556, filed on Feb. 19, 2020, and Korean Patent Application No. 10-2021-0022404 filed on Feb. 19, 2021, the disclosure of which is incorporated herein by reference in its entirety.

TECHNICAL FIELD

The present invention relates to a semiconductor package, and more particularly, to a semiconductor package capable of shortening the process.

BACKGROUND

In general, semiconductor chips manufactured by performing various semiconductor processes on a wafer are subjected to a semiconductor package process to manufacture a semiconductor package. Recently, in order to reduce the production cost of a semiconductor package, a wafer level package technology has been proposed that performs a semiconductor package process at the wafer level and individualizes the wafer level semiconductor package that has undergone the semiconductor package process into individual units.

Such a semiconductor package is mounted on a board through an external connection terminal protruding from the outside of the semiconductor package. Specifically, after a passivation process for forming an insulating layer on a semiconductor chip, a wiring pattern is formed, and then a passivation process for forming an insulating layer is repeated. In addition, a process of electrically connecting the chip pad and the wiring pattern by forming an opening through which at least a part of the semiconductor chip can be exposed is followed in each passivation process.

However, there is a problem in that cost and time are increased due to the repeated passivation process and the wiring pattern connection process. There is a need for a semiconductor package that can improve this and shorten the process.

The above information disclosed in this Background section is only for enhancement of understanding of the background of the invention and it may therefore contain information that does not form the prior art that is already known to a person of ordinary skill in the art.

SUMMARY

An embodiment of the present invention is directed to providing a semiconductor package in which some passivation and wiring pattern connection processes can be partially omitted.

In addition, an embodiment of the present invention is directed to providing a semiconductor package with improved electrical connection while simplifying a structure and a process.

An embodiment of the present invention provides a semiconductor package, including: a semiconductor chip having at least one chip pad disposed on one surface thereof; a wiring pattern disposed on top of the semiconductor chip and having at least a portion thereof in contact with the chip pad to be electrically connected to the chip pad; and a solder bump disposed on outer surface of the wiring pattern to be electrically connected to the chip pad through the wiring pattern.

Another embodiment of the present invention provides a semiconductor package, including: a semiconductor chip having at least one chip pad disposed on one surface thereof; a wiring pattern disposed on top of the semiconductor chip and having at least a portion thereof in contact with the chip pad to be electrically connected to the chip pad; a solder bump disposed on outer surface of the wiring pattern to be electrically connected to the chip pad through the wiring pattern; a PCB substrate electrically connected to an upper portion of the solder bump; and an underfill filled to surround the wiring pattern and the solder bump in a space formed between the semiconductor chip and the PCB substrate.

In this case, the wiring pattern may include an isolated portion having a predetermined area to limit the flow range of the solder bump in a molten state, and supporting the solder bump; and an inducting portion extending horizontally from one side of the isolated portion so that the molten state solder bump flows a predetermined distance to form a protruding projection, wherein the line width of the inducting portion may be 1% to 15% of the line width of the solder bump.

In this case, the wiring pattern may include an isolated portion having a predetermined area to limit the flow range of the solder bump in a molten state, and supporting the solder bump; and an inducting portion extending horizontally from one side of the isolated portion so that the molten state solder bump flows a predetermined distance to form a protruding projection, wherein the length of the protruding projection protruding from the solder bump may be 0.1 to 20 um.

In this case, the wiring pattern may include an isolated portion having a predetermined area to limit the flow range of the solder bump in a molten state, and supporting the solder bump; and an inducting portion extending horizontally from one side of the isolated portion so that the molten state solder bump flows a predetermined distance to form a protruding projection, wherein the solder bump may include a core ball in the center thereof.

In this case, the wiring pattern may be formed in a form of a pad, and the wiring pattern may include a plurality of slits penetrating the wiring pattern, spaced apart from each other, and disposed to surround a lower portion of the solder bump; an inner space portion supporting the solder bump and provided inside the plurality of slits; and an outer space portion provided outside the plurality of slits, wherein at least one passage may be formed between the plurality of slits so that the molten state solder bump flows a predetermined distance to form a protruding projection, and the sum of the line width of the at least one passage may be 1% to 15% of the line width of the solder bump.

In this case, the semiconductor package may further include an insulating pattern disposed on top of the semiconductor chip and disposed to expose at least a portion of the chip pad, wherein the wiring pattern may be disposed on top of the insulating pattern, at least a portion of the wiring pattern may be in contact with the exposed portion of the chip pad to be electrically connected to the chip pad, and an oxide layer generated by a chemical reaction with the material of the wiring pattern or an organic solderability preservative including an organic compound selectively combined with the material of the wiring pattern may be formed on at least a portion of the outer surface of the wiring pattern except for the portion on which the solder bump is disposed.

In this case, the semiconductor chip may be buried by an encapsulation portion in a state in which a portion of the upper surface thereof is open, and the wiring pattern may be disposed on top of the semiconductor chip and the encapsulation portion.

In this case, a conductive pillar may be disposed on top of the chip pad, the semiconductor chip may be buried by an encapsulation portion in a state in which the conductive pillar is disposed, and the wiring pattern may be disposed on top of the encapsulation portion to be electrically connected to the conductive pillar.

In this case, a side surface of the wiring pattern, and a portion of an upper surface of the wiring pattern excluding a portion contacting the solder bump may be in contact with the underfill.

In this case, a lower side surface of the wiring pattern and at least a portion of the underfill may be disposed on a same plane.

Still another embodiment of the present invention provides a semiconductor package, including: an insulating body; an upper wiring pattern disposed on the insulating body; a lower wiring pattern disposed on a lower surface of the insulating body; a connecting wiring pattern disposed in the insulating body and connecting the upper wiring pattern and the lower wiring pattern; a semiconductor chip disposed on the insulating body and comprising a chip pad electrically connected to the upper wiring pattern; and a solder bump disposed on outer surface of the lower wiring pattern to be electrically connected to the semiconductor chip.

In this case, the lower wiring pattern may include an isolated portion having a predetermined area to limit the flow range of the solder bump in a molten state, and supporting the solder bump; and an inducting portion extending horizontally from one side of the isolated portion so that the molten state solder bump flows a predetermined distance to form a protruding projection, wherein the line width of the inducting portion may be 1% to 15% of the line width of the solder bump, the length of the protruding projection protruding from the solder bump may be 0.1 um to 20 um, and the solder bump may include a core ball in the center thereof.

The semiconductor package according to an embodiment of the present invention configured as described above has a wiring pattern of a structure that spatially isolates the solder bump but is partially open only in the design flow direction, thereby capable of effectively maintaining a spherical shape of the solder bump without a separate process.

In addition, the semiconductor package according to an embodiment of the present invention replaces an additional passivation by forming the oxide layer or the organic solderability preservative on the wiring pattern, thereby capable of reducing the semiconductor package manufacturing process.

In addition, the semiconductor package according to an embodiment of the present invention includes a unique core ball in the solder bump, thereby capable of more effectively maintaining a spherical shape of the solder bump.

BRIEF DESCRIPTION OF THE DRAWINGS

The above and other aspects, features, and advantages of the present invention will become more apparent to those of ordinary skill in the art by describing embodiments thereof in detail with reference to the accompanying drawings, in which.

Figure 1:
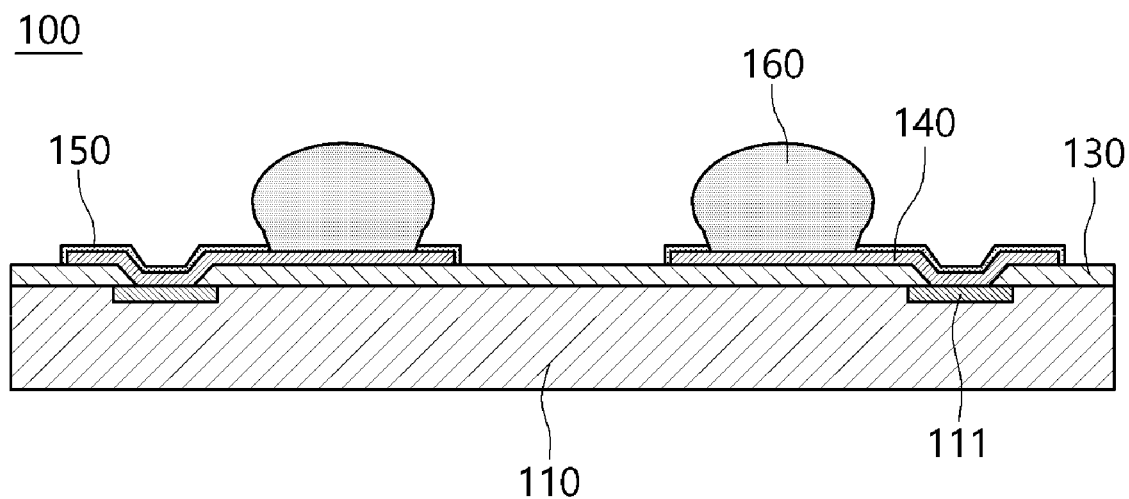
FIG. 1 is a diagram illustrating a cross-section of a semiconductor package according to an exemplary embodiment of the present invention.

| Description of Symbols | |
|---|---|
| 100, 200, 300, 400, 500 semiconductor package | 110 semiconductor chip |
| 111 chip pad | 130 insulating pattern |
| 131 first insulating layer | 132 second insulating layer |
| 140 wiring pattern | 141 isolated portion |
| 142 inducting portion | 143 slit |
| 144 inner space portion | 145 outer space portion |
| 146 passage | 150 oxide layer |
| 152 mask pattern | 160 external connection terminal |
| 170 organic solderability preservative | 190 underfill |

DETAILED DESCRIPTION OF THE EMBODIMENTS

Hereinafter, exemplary embodiments of the present invention will be described in detail so that those of ordinary skill in the art can readily implement the present invention with reference to the accompanying drawings. The present invention may be embodied in many different forms and are not limited to the embodiments set forth herein. In the drawings, parts unrelated to the description are omitted for clarity. Throughout the specification, like reference numerals denote like elements.

It is understood that the terms "comprise" or "have" when used in this specification, are intended to specify the presence of stated features, integers, steps, operations, members, components and/or a combination thereof but not preclude the possibility of the presence or addition of one or more other features, integers, steps, operations, members, components, or a combination thereof.

The z-axis direction, which is a direction in which each component of a semiconductor package according to various embodiments of the present invention is stacked, is referred to as a "first direction", and an x-axis direction or a y-axis direction, which is a direction in a plane perpendicular to the z-axis, is referred to as a "second direction". In addition, for each component of a semiconductor package according to various embodiments of the present invention, the length in the first direction (z-axis direction) is referred to as "thickness", "depth" or "height" of the component, and each length in the second direction (x-axis direction and y-axis direction) is referred to as "breadth" and "width" of the component.

Figure 2:
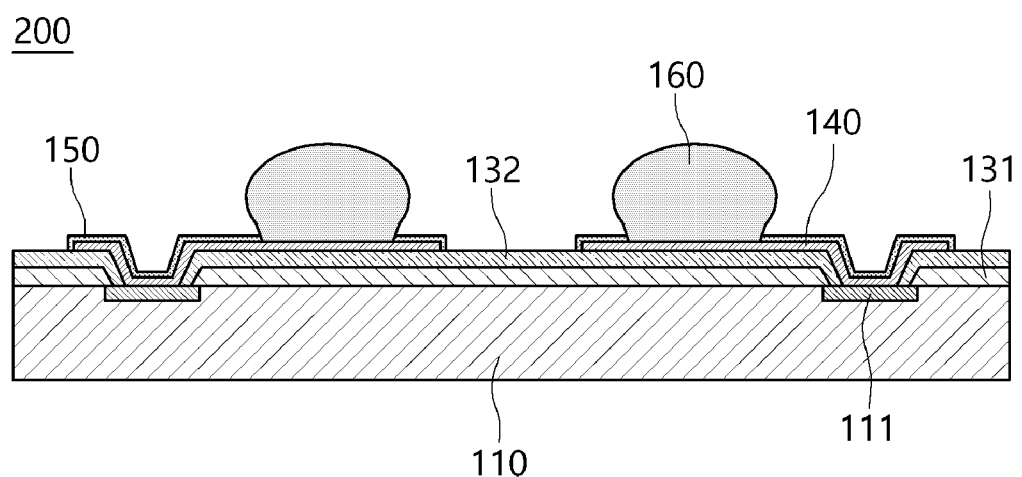
FIG. 2 is a diagram illustrating a cross-section of a semiconductor package according to another exemplary embodiment of the present invention.

FIG. 1 is a diagram illustrating a cross-section of a semiconductor package according to a first exemplary embodiment of the present invention. FIG. 2 is a diagram illustrating a cross-section of a semiconductor package according to a second exemplary embodiment of the present invention.

As shown in FIGS. 1 and 2, semiconductor packages 100 and 200 according to the first and second embodiments of the present invention may include a semiconductor chip 110, an insulating pattern 130, a wiring pattern 140, an oxide layer 150, and an external connection terminal 160.

The semiconductor chip 110 is a semiconductor device and may include one or a plurality of individual devices of various types. For example, a plurality of individual devices may include photoelectronic devices such as microelectronic devices, CMOS transistors (complementary metal-oxide semiconductor transistor), MOSFET (metal-oxide semiconductor field effect transistor), system LSI (large scale integration), and CIS (CMOS imaging sensor), MEMS (micro-electro-mechanical system), elastic wave filter devices, active devices, passive devices, etc., but are not limited thereto.

The semiconductor chip 110 may be a memory semiconductor chip. For example, the memory semiconductor chip may be a volatile memory semiconductor chip such as DRAM (Dynamic Random Access Memory) or SRAM (Static Random Access Memory), or a nonvolatile memory semiconductor chip such as PRAM (Phase-change Random Access Memory), MRAM (Magneto-resistive Random Access Memory), FeRAM (Ferroelectric Random Access Memory) or RRAM (Resistive Random Access Memory), but is not limited thereto.

The semiconductor chip 110 may be a logic chip. For example, the logic chip may be a CPU (Central Processor Unit), MPU (Micro Processor Unit), GPU (Graphic Processor Unit) or AP (Application Processor), but is not limited thereto.

In FIG. 1 and the like, the semiconductor packages 100 and 200 are illustrated as including one semiconductor chip 110, but the semiconductor packages 100 and 200 may include a plurality of semiconductor chips 110. The plurality of semiconductor chips 110 included in the semiconductor packages 100 and 200 may be the same type of semiconductor chips or different types of semiconductor chips. In addition, the semiconductor packages 100 and 200 may be a system in package (SIP) in which different types of semiconductor chips are electrically connected to each other to operate as a single system.

The width and breadth of the semiconductor chip 110 may be about 2 mm to about 10 mm. More specifically, the width and breadth of the semiconductor chip 110 may be about 4 mm to about 7 mm. However, the width and breadth of the semiconductor chip 110 are not limited thereto, and may have more various values. In addition, the thickness of the semiconductor chip 110 may be about 100 µm to about 400 µm. More specifically, the thickness of the semiconductor chip 110 may be about 150 µm to about 350 µm. However, the thickness of the semiconductor chip 110 is not limited thereto, and may have more various values.

The semiconductor chip 110 may include a first surface and a second surface opposite to the first surface. A chip pad 111 may be formed on the first surface of the semiconductor chip 110. The chip pad 111 may be electrically connected to a plurality of individual devices of various types formed on the semiconductor chip 110. The chip pad 111 may have a thickness between about 0.5 µm and about 1.5 µm. However, the thickness of the chip pad 111 is not limited thereto, and may have more various values.

The chip pad 111 may input/output input/output signals of the semiconductor chip 110. That is, the chip pad 111 may be electrically connected to the integrated circuit of the semiconductor chip 110 to extend the function of the semiconductor chip 110 to the outside. For example, the chip pad 111 may be made of a metal having a low specific resistance such as aluminum or copper, but is not limited thereto. In FIG. 1 and the like, it is illustrated that there are two chip pads 111, but the number of chip pads 111 is not limited thereto, and may be a larger number.

The insulating pattern 130 have a structure including a non-conductive material, and may be provided on the first surface of the semiconductor chip 110 to protect the semiconductor chip 110 and prevent unnecessary electrical short circuits.

In this case, the insulating pattern 130 may be made of an insulating polymer, an epoxy, a silicon oxide film, a silicon nitride film (SiN), or a combination thereof. Alternatively, the insulating pattern 130 may be made of a non-photosensitive material or a photosensitive material, respectively.

In this case, the insulating polymer may include a general-purpose polymer such as PMMA (Polymethylmethacrylate), PS (Polystyrene), and PBO (Polybenzoxazole), an acrylic based polymer, an imide based polymer (polyimide (PI)), an aryl ether based polymer, an amide based polymer, a fluorine based polymer, a p-xylene based polymer, a vinyl alcohol based polymer, a polymer derivative having a phenolic group, or a combination thereof.

However, in the case of FIGS. 1 and 2, it is shown that the insulating pattern 130 includes polyimide (PI) or silicon nitride film (SiN), but the material of the insulating pattern 130 is not limited to not only to those shown in the drawings but also to the above-described example, and may be made of a variety of materials.

Meanwhile, the insulating pattern 130 may have a structure in which a plurality of insulating layers are stacked. That is, as shown in FIG. 2, in the semiconductor package 200 according to the first and second exemplary embodiments of the present invention, the insulating pattern 130 may include a first insulating layer 131 and a second insulating layer 132 which are sequentially stacked. As an example, it may include the first insulating layer 131 which is provided on the first surface of the semiconductor chip 110 and formed of a silicon nitride film (SiN), and the second insulating layer 132 which is provided on the first insulating layer 131 and formed of a polyimide (PI).

The wiring pattern 140 has a structure including a conductive material, and may transmit an electric signal of the chip pad 111 or an external device (e.g., a board), etc. in the first direction and the second direction. That is, the wiring pattern 140 may be electrically connected to the chip pad 111 of the semiconductor chip 110 and may provide an electrical connection path for electrically connecting the chip pad 111 to an external device. In this case, the wiring pattern 140 may be provided in the insulating pattern 130 and may include various structures depending on the thickness of the insulating pattern 130. For example, the wiring pattern 140 may be made of W, Cu, Zr, Ti, Ta, Al, Ru, Pd, Pt, Co, Ni, or a combination thereof.

The oxide layer 150 may be present on at least a portion of the top surface and the outer side surface of the wiring pattern 140. The oxide layer 150 refers to a layer formed by chemically reacting at least some of the materials constituting the wiring pattern 140 through a special process. Such an oxide layer 150 may act as if the outer surface of the wiring pattern 140 is coated, thereby enhancing corrosion resistance and abrasion resistance of the wiring pattern 140.

Through this, by substituting the conventional process in which after the wiring pattern 140 is formed, an insulating pattern is repeatedly formed, and an external pad is opened to connect an external connection terminal, the wiring pattern 140 may be effectively protected only by a chemical process for forming the oxide layer 150.

Meanwhile, as an example of forming the oxide layer 150, a black oxide process may be used, and as a result, the oxide layer 150 may be formed of a black oxide layer. In this case, when the wiring pattern 140 is formed of Cu, the oxide layer 150 generated by the black oxide process may include copper oxide such as CuO or Cu2O. The formation of the oxide layer 150 using a black oxide process will be described in more detail through the following part.

Referring again to FIGS. 1 and 2, the oxide layer 150 may be formed by an oxidation reaction only for a partial region of the wiring pattern 140, and a metal oxidation reaction may not occur for the remaining portion of the wiring pattern 140 so that the external connection terminal 160 and the wiring pattern 140, which will be described later, can be in contact with each other. This will be described later.

The external connection terminal 160 is a terminal that transmits electric signals from the semiconductor packages 100 and 200 to an external device, and may be provided on the wiring pattern 140. That is, the external connection terminal 160 may be electrically connected to the wiring pattern 140. Accordingly, the external connection terminal 160 may be electrically connected to the chip pad 111 of the semiconductor chip 110 through the wiring pattern 140, and may be configured to electrically connect the semiconductor packages 100 and 200 and an external device (for example, board, etc.). That is, the external connection terminal 160 may be a connection terminal for mounting the semiconductor packages 100 and 200 on a board such as a printed circuit board, which is an external device.

For example, the external connection terminal 160 may include a solder bump, and may include Sn, Au, Ag, Ni, In, Bi, Sb, Cu, Zn, Pb, or a combination thereof, but it is not limited thereto. In addition, the solder bump may have a ball shape, but is not limited thereto, and may have various shapes such as a cylinder, a polygonal column, and a polyhedron.

In the semiconductor packages 100 and 200 according to the first and second embodiments of the present invention, the electrical signal generated from the semiconductor chip 110 may be transmitted to an external device connected to the external connection terminal 160 by passing through in order the chip pad 111, the wiring pattern 140 and the external connection terminal 160. In addition, the electric signal generated from the external device may be transmitted to the semiconductor chip 110 by passing through in order the external connection terminal 160, the wiring pad 140, and the chip pad 111. During the electric signal transmission process, the insulating pad 130 and the oxide layer 150 may prevent unnecessary electrical short circuits to the chip pad 111 and the wiring pattern 140, and prevent physical/chemical damage to these components.

Hereinafter, a method of manufacturing the semiconductor packages 100 and 200 according to the first and second embodiments of the present invention will be described with reference to the drawings.

FIGS. 3A to 3F are diagrams for sequentially explaining a method of manufacturing a semiconductor package according to the first embodiment of the present invention shown in FIG. 1, and are diagrams illustrating a cross-section of the semiconductor package at each step. FIGS. 4A to 4G are diagrams for sequentially explaining a method of manufacturing a semiconductor package according to the second embodiment of the present invention shown in FIG. 2, and are diagrams illustrating a cross-section of the semiconductor package at each step. As already discussed, the embodiment shown in FIG. 1 and the embodiment shown in FIG. 2 differ only in the stacking method of the insulating pattern 130, and the formation of other configurations is the same or similar, so duplicate descriptions are avoided, and only the differences will be emphasized and described.

Figure 3:
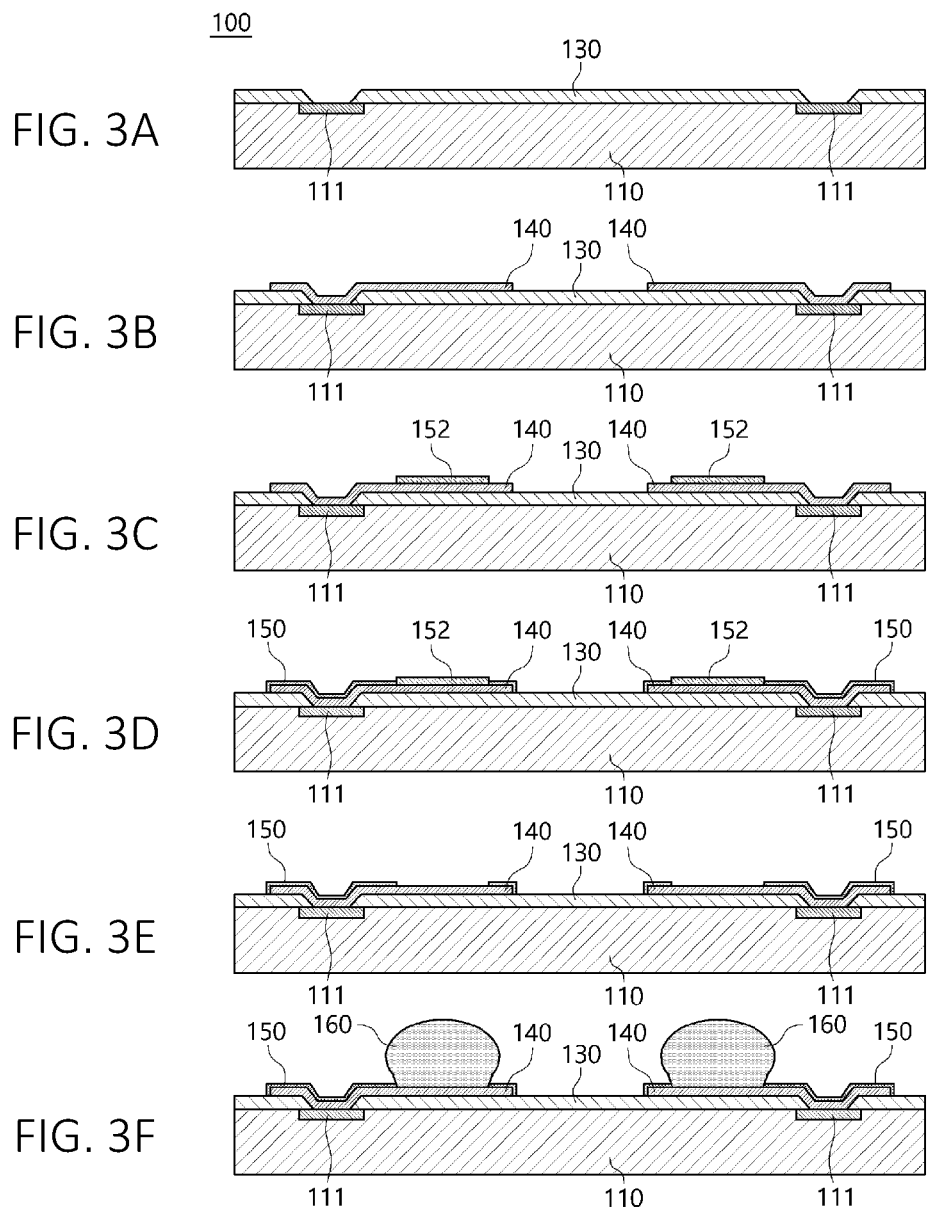
FIGS. 3A to 3F are diagrams for sequentially explaining a method of manufacturing a semiconductor package according to an exemplary embodiment of the present invention, and are diagrams illustrating a cross-section of the semiconductor package at each step.
Figure 4:
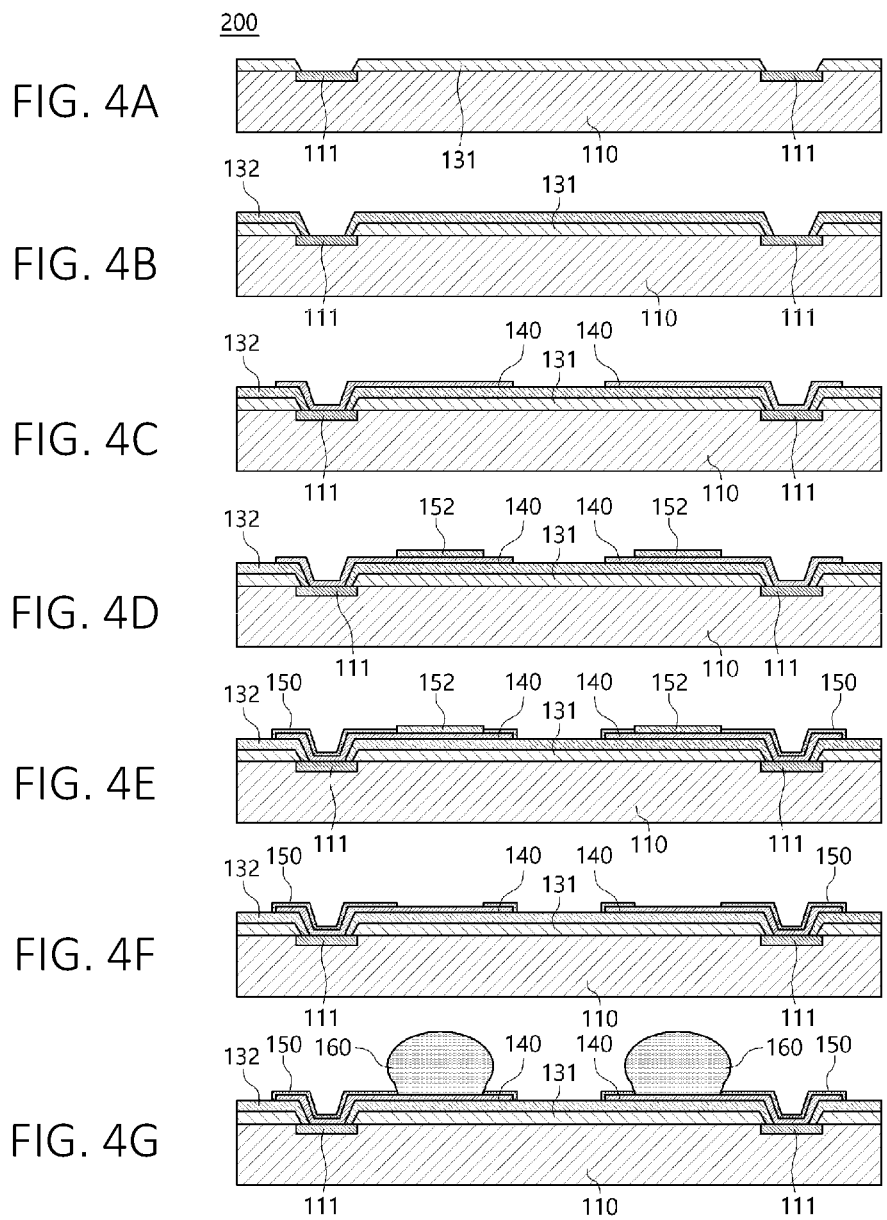
FIGS. 4A to 4G are diagrams for sequentially explaining a method of manufacturing a semiconductor package according to another exemplary embodiment of the present invention, and are diagrams illustrating a cross-section of the semiconductor package at each step.

The method of manufacturing a semiconductor package according to the first and second embodiments of the present invention may, first, form the insulating pattern 130 on the first surface of the semiconductor chip 110 having the chip pad 111 (see FIGS. 3A and 4A). In this case, by removing a part of an upper surface of the insulating pattern 130 through an etch back process or a polishing process, the height of the insulating pattern 130 may be lowered and the surface roughness of the upper surface may be increased. As the surface roughness of the upper surface of the insulating pattern 130 is increased as described above, adhesion between the wiring pattern 140 and a first insulating pattern 130 formed a subsequent process may be strengthened.

Meanwhile, the insulating pattern 130 may be formed through a film lamination process using a solid state insulating film. For example, the insulating pattern 130 may be formed by applying an insulating film in a semi-cured state (i.e., B-stage) and performing a pre-cure process. However, it is not limited to the above, and the insulating pattern 130 may be formed using a liquid material. In this case, residual stress may be generated in the insulating pattern 130 during heat shrinkage of the liquid material. That is, when the insulating pattern 130 is formed using a solid state insulating film, it is possible not only to minimize the generation of residual stress due to heat shrinkage, but also to easily form the insulating pattern 130 having a relatively thick thickness.

Meanwhile, as shown in FIG. 2, when the insulating pattern 130 has a structure in which a plurality of insulating layers are stacked, after forming the first insulating layer 131 on the first surface of the semiconductor chip 110, subsequently the second insulating layer 132 may be formed on the first insulating layer 131 (see FIGS. 4A and 4B). For example, after forming a silicon nitride film (SiN) primarily on the first surface of the semiconductor chip 110, it may be formed by laminating polyimide (PI) on the upper surface of the silicon nitride film. Of course, in this case, as described above, by removing a part of the upper surface of the first insulating layer 131 or the second insulating layer 132 through an etch back process or a polishing process, the height may be lowered and the surface roughness of each upper surface may be increased. In this case, the increased surface roughness of the first insulating layer 131 may be greater than the surface roughness of the upper and lower surfaces of the second insulating layer 132 formed through a subsequent process.

Thereafter, after an opening in which a portion of the chip pad 111 is exposed through an etching process or the like is formed on the upper surface of the insulating pattern 130, the wiring pattern 140 may be formed on the insulating pattern 130 (see FIGS. 3B and 4C). That is, the wiring pattern 140 extends along the upper surface of the insulating pattern 130 and may be electrically connected to the chip pad 111 of the semiconductor chip 110. In this case, the opening of the insulating pattern 130 may have a tapered shape or a stepped shape, and a portion of the wiring pattern 140 formed on the opening of the insulating pattern 130 may also have a tapered shape or a stepped shape, but it is not limited thereto. For example, the opening of the insulating pattern 130 may be formed through stamping, etching, polishing, chemical and mechanical polishing (CMP), grinding or a combination of these processes, but it is not limited thereto.

In addition, in order to form the wiring pattern 140, a seed metal layer covering at least a portion of the upper surface of the insulating pattern 130 may be formed, and a plating process using the seed metal layer as a seed may be performed. For example, the wiring pattern 140 may be formed through immersion plating, electroless plating, electroplating, or a combination thereof, but it is not limited thereto.

Next, a mask pattern may be disposed on a portion of the upper surface of the wiring pattern 140 where the external connection terminal 160 is to be contacted (see FIGS. 3C and 4D). In this case, the mask pattern 152 may be a covering material formed of a material having chemical resistance or thermal resistance. Here, the material having chemical resistance or thermal resistance may include Sn, Au, Ag, Ni, In, Bi, Sb, Cu, Zn, Pb, or a combination thereof, but is not limited thereto. In the process for forming the oxide layer 150 to be described later (see FIGS. 3D and 4E), the mask pattern 152 is used to protect a portion of the upper surface of the wiring pattern 140 to be connected to the external connection terminal 160 against chemical reactions such as corrosion. To form the mask pattern 152, a process applying the above-described material having chemical resistance or thermal resistance in a molten state to at least a portion of the surface of the wiring pattern 140 or plating a material having chemical resistance such as gold (Au) on a portion of the surface of the wiring pattern 140 may be performed.

Next, the oxide layer 150 may be formed on at least a portion of the outer surface of the wiring pattern 140 (see FIGS. 3D and 4E). As already described above, in order to enhance the corrosion resistance and abrasion resistance of the wiring pattern 140, the oxide layer 150 may be formed by chemically reacting at least some of the materials constituting the wiring pattern 140 by a special process. In this case, a region of the upper surface of the wiring pattern 140 on which the mask pattern 152 is disposed is protected by the mask pattern 152 so that a chemical reaction does not occur. Therefore, when the mask pattern 152 is removed later, a portion of the upper surface of the wiring pattern 140 that is not damaged due to a chemical reaction and the external connection terminal 160 may be connected to each other.

In this case, as an example of forming the oxide layer 150, a black oxide process may be used. The black oxide process may be further subdivided and may include a step of cleaning the wiring pattern surface, a step of forming surface roughness, a step of pre-dip, a step of forming the oxide layer, and a step of drying. For example, when the wiring pattern includes Cu, the black oxide process may oxidize the Cu surface to form a copper oxide layer (CuO or Cu2O). In more detail, the formation of the copper oxide layer on the surface of the wiring pattern 140 may be performed by an alkali treatment. For the alkali treatment, sodium hydroxide, potassium hydroxide, or the like may be used. In addition, in order to make the copper oxide layer uniform, it is preferable to add an additive. For the additive, salts such as sodium sulfate, sodium citrate, and sodium acetate, or surfactants may be used. The copper oxide layer may be formed by immersing the wiring pattern 140 in these treated liquids or spraying these treated liquids on the wiring pattern 140.

Next, the mask pattern 152 disposed on the portion of the upper surface of the wiring pattern 140 may be removed (see FIGS. 3E and 4F). This is to expose to the outside the area of the wiring pattern 140 that has been protected from the black oxide process by disposing the mask pattern 152. In this case, solder resist removal may be performed through stamping, etching, polishing, chemical and mechanical polishing (CMP), grinding or a combination of these processes, but it is not limited thereto.

Finally, the external connection terminal 160 may be formed on the wiring pattern 140. That is, by removing the mask pattern 152, the external connection terminal 160 electrically connected to the wiring pattern 140 exposed to the outside may be formed (see FIGS. 3F and 4G). As shown in the drawing, after disposing a solder bump of a spherical shape or a ball shape, the external connection terminal 160 may be formed by performing a reflow process.

Meanwhile, after applying a flux on a cover layer and disposing a solder bump of a spherical shape or a ball shape on the cover layer on which the flux is applied, the external connection terminal 160 may be formed by performing a reflow process. For example, the reflow process may be performed at a temperature of 200° C. to 280° C. for several tens of seconds to several minutes. During the reflow process, the cover layer may spread, and a third metal material included in the cover layer may react with a first metal material included in the wiring pattern 140 and a second metal material included in the external connection terminal 160 at a high temperature, and as a result, an intermetallic compound layer may be formed. Such an intermetallic compound layer may be formed along the surface of the wiring pattern 140. For example, when the wiring pattern 140 includes Cu and/or Ni, the external connection terminal 160 includes Sn and/or Cu, and the cover layer includes Au, it may include an intermetallic compound layer of Cu—Ni—Sn—Au. However, the material or composition of the intermetallic compound layer is not limited thereto, and may vary depending on the material of the wiring pattern 140, the material of the external connection terminal 160, the material of the cover layer, and the temperature and time of the reflow process.

However, specific numerical values and process methods for the above-described cover layer and the external connection terminal 160 are not limited thereto and may be more various.

Thereafter, it may be subjected to final processing to be semiconductor packages 100 and 200. That is, when a plurality of semiconductor packages 100 and 200 connected to each other, such as a wafer-level package, have been manufactured, they may be individualized into individual semiconductor packages 100 and 200 by cutting along a scribe line or the like.

Meanwhile, unlike the above-described method using the mask pattern 152, after first disposing a solder bump of a spherical shape or a ball shape on the wiring pattern 140 (to form the external connection terminal 160), the oxide layer 150 may be formed. That is, in the above-described method, the step of disposing the mask pattern may be omitted, and immediately after the solder bump is disposed, for example, the outer surface of the wiring pattern 140 may be oxidized by performing a black oxide process. In this case, since the steps of disposing and removing the mask pattern are omitted, the process may be reduced more effectively.

Hereinafter, semiconductor packages 300 and 400 according to the third and fourth embodiments of the present invention will be described. The semiconductor packages 300 and 400 according to the third and fourth embodiments of the present invention are semiconductor packages having the same configuration as some of the configurations of the first and second embodiments of the present invention described above, so compared with the above-described semiconductor packages 100 and 200, duplicate descriptions of the same components are avoided, and differences will be mainly described.

Figure 5:
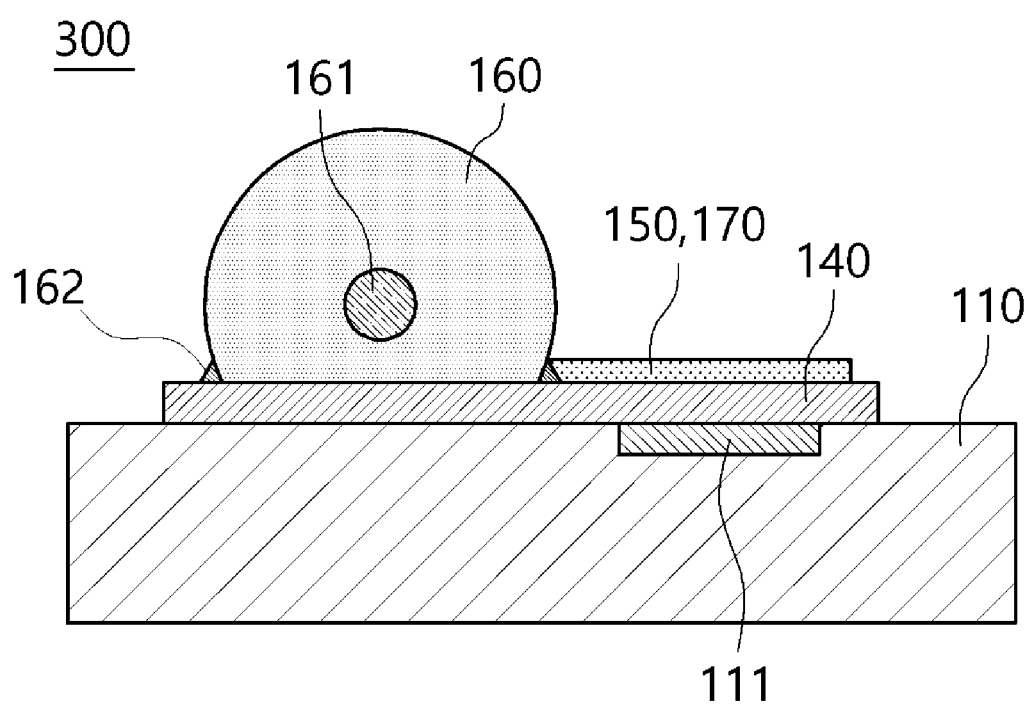
FIG. 5 is a diagram illustrating a cross-section of a semiconductor package according to a third exemplary embodiment of the present invention.

First, as shown in FIG. 5, the semiconductor package 300 according to the third embodiment of the present invention may include a semiconductor chip 110, a wiring pattern 140, and an external connection terminal 160.

In this case, the semiconductor package 300 may omit the insulating pattern 130 as compared to the first and second embodiments described above in order to minimize process steps and maximize economic feasibility. That is, the wiring pattern 140 may be formed on the semiconductor chip 110.

In this way, the omission of the insulating pattern 130 is possible because an underfill 190 is filled between the semiconductor chip 110 and a PCB substrate 10 when the semiconductor package 300 according to the third embodiment of the present invention is mounted on the PCB substrate 10, which will be described later.

In addition, as shown in FIG. 5, the semiconductor package 300 according to the third embodiment of the present invention may form the external connection terminal 160 directly on the wiring pattern 140 without adding a separate UBM (Under Bump Metallurgy) layer.

According to the related art, in order to provide an external connection terminal 160 such as a solder bump on a wiring pattern, a separate UBM layer is required to prevent spread of the solder bump. However, forming such a UBM layer separately requires an additional operation, so it may be a burden on the manufacturing process. So, the inventors of the present invention invented the semiconductor packages 300 and 400 capable of maintaining a spherical shape by effectively preventing the spread of solder bumps without the addition of the UBM layer.

Specifically, the semiconductor package 300 according to the third embodiment of the present invention may include a unique wiring pattern 140 to effectively maintain the spherical shape of the solder bump 160 without the UBM layer. However, it is noted that the spherical shape in the present specification does not mean a complete sphere in a mathematical sense, but generally means having a shape similar to a sphere, and thus a part of the solder bump 160 in contact with the wiring pattern 140 may partially include a plane.

In this case, the wiring pattern 140 may be formed to allow a molten solder bump 160 to flow in a design flow direction, but to restrict flow in a direction other than the design flow direction.

That is, in the third embodiment of the present invention, the wiring pattern 140 may be formed in a structure that spatially isolates the solder bump 160 but is spatially opened only in the design flow direction.

Figure 6:
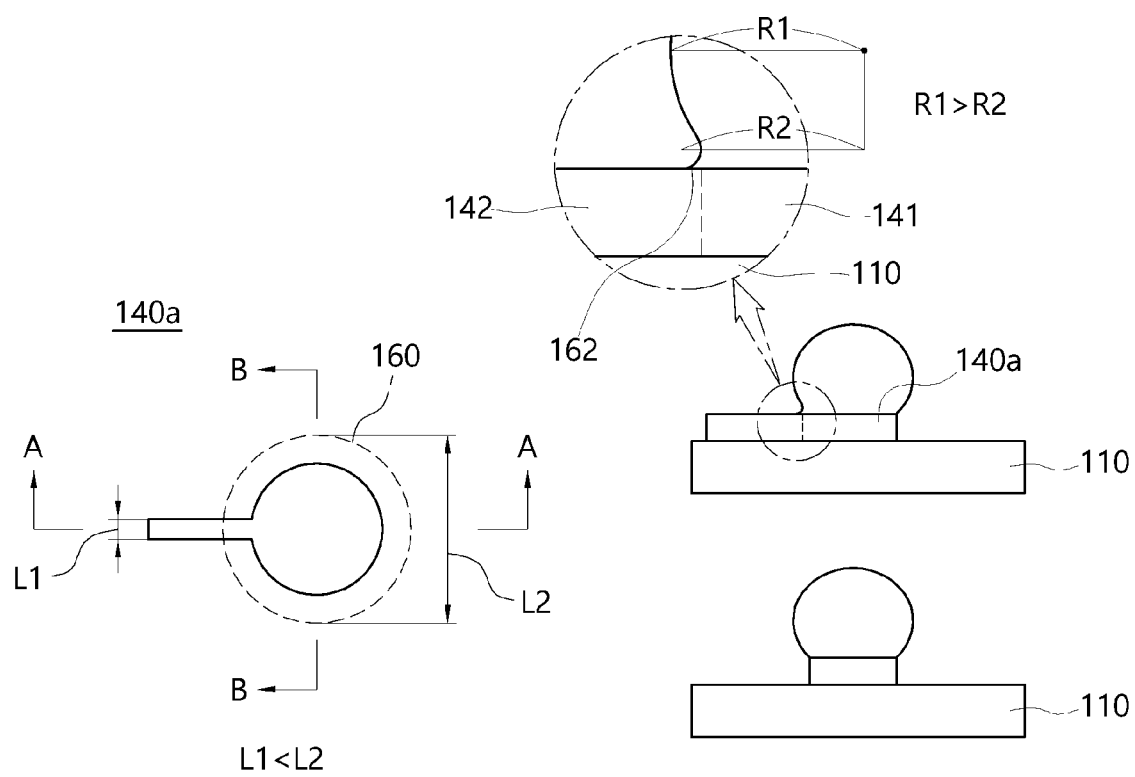
FIGS. 6, 7A-7B, and 8A to 8D are diagrams illustrating an example of a baton pattern applied to a semiconductor package according to various embodiments of the present invention.

As a specific example, as shown in FIG. 6, the wiring pattern 140*a* may include an isolated portion 141 supporting the solder bump 160 and an inducting portion 142 extending from the isolated portion 141.

In this case, the isolated portion 141 is a portion of the wiring pattern 140*a* on which the molten solder bump 160 is seated, and may have a predetermined area to limit the flow range of the solder bump 160. For example, the isolated portion 141 may be formed in a circular shape as shown in FIG. 6 so as to correspond to the lower portion of the solder bump 160 formed in a spherical shape.

The flow of the solder bump 160 in the molten state in the horizontal direction may be limited due to a step formed between the isolated portion 141 having a predetermined area and the semiconductor chip 110 disposed on the lower portion. As a result, the surface of the liquid state solder bump 160 shrinks by itself within the isolated portion 141 of a limited area, thereby creating a surface tension willing to take a small area as possible, whereby the solder bump 160 may effectively maintain the spherical shape without a separate UBM layer.

That is, the isolated portion 141 may spatially isolate the solder bump 160 so that the surface tension inside the solder bump 160 in a molten state is effectively generated.

In the third embodiment of the present invention, referring again to FIG. 6, the wiring pattern 140*a* may include an inducting portion 142 protruding and extending a predetermined length in the horizontal direction from one side of the isolated portion 141.

In this case, the inducting portion 142 is provided so that flow range of the molten state solder bump 160 is limited by the isolated portion 141 described above but a predetermined amount of flow in a predetermined design flow direction is allowed.

In this way, allowing some of the flow of the solder bump 160 through the inducting portion 142 is to prevent the generation of repulsive force between molecules constituting the solder bump 160 based on the increased attractive force as the distance between molecules constituting the solder bump 160 becomes very close when only the isolated portion 141 is disposed. That is, when the repulsive force between molecules becomes excessive, the solder bump 160 may no longer maintain a spherical shape and may flow toward the semiconductor chip 110 adjacent to the isolated portion 141.

In order to prevent this, the inducting portion 142 may induce a small amount of the solder bump 160 to flow only in a limited direction so that a protruding projection 162 protruding outward from the solder bump 160 may be formed. Through this, the solder bump 160 may properly maintain a distance between molecules.

In this case, the inducting portion 142 may have a line width L1 narrower than a line width L2 of the solder bump 160. Here, the line width (L2) of the solder bump is defined as the distance between opposite ends of the solder bump 160 as shown in the drawing, and the line width (L1) of the inducting portion is defined as the width of the inducting portion measured in the direction perpendicular to the protruding direction of the inducting portion.

As described above, in the third embodiment of the present invention, the reason why the inducting portion 142 has a narrower line width L1 than the line width L2 of the solder bump 160 is because if the line width L1 of the inducting portion is larger than the line width L2 of the solder bump, the solder bump 160 may not maintain a spherical shape on the isolated portion 141 but mostly flow toward the inducting portion 142.

As a specific example related to this, the line width L1 of the inducting portion may be 15% or less compared to the line width L2 of the solder bump. On the other hand, if the line width L1 of the inducting portion is too small compared to the solder bump, there is a problem in that the conductivity is lowered. When the above-described contents are comprehensively considered, it is effective that the line width L1 of the inducting portion is 3% or more to 7% or less compared to the line width L2 of the solder bump. If a plurality of inducting portions are formed, the sum of the line widths of the plurality of inducting portions may be 3% or more to 7% or less of the line width of the solder bump.

In the third embodiment of the present invention, a plurality of the inducting portions 142 may be formed to be spaced apart from each other along the outer circumference surface of the isolated portion 141 according to a design.

In this case, the plurality of inducting portions may be disposed to be symmetrical with respect to the isolated portion 141 so that a uniform amount of solder bumps 160 flows in the horizontal direction to form a plurality of protruding projections 162. Through this, by making uniform the directional nature of the surface tension in the solder bump 160, the solder bump 160 may more stably maintain the spherical shape.

Meanwhile, as described above, the flow of the solder bump 160 in the molten state by the inducting portion 142 flows in the design flow direction, but the maximum flow range may be limited due to the surface tension formed in the solder bump 160 In more detail, as shown in FIG. 6, the range that the solder bump 160 flowing through the inducting portion 142 can reach maximum, that is, the maximum protrusion length of the protruding projection 162 may be 0.1 um to 20 um. In this case, it is preferable that the protruding projection 162 does not deviate from the outermost part of the solder bump 160. Through this, even if a part of the solder bump 160 flows through the inducting portion 142, the solder bump may maintain the spherical shape as much as possible. However, embodiments of the present invention are not limited thereto, and the protruding projection 162 may deviate from the outermost portion of the solder bump 160 according to a design.

In the third embodiment of the present invention, the shape of the inducting portion 142 may be formed in a wide variety according to a design.

As a non-limiting example, as shown in FIGS. 8A to 8D, it may be formed in a shape that the line width may gradually increase from a portion connected to the isolated portion 141 toward the outside, or vice versa. In addition to this, it should be noted that the shape of the inducting portion 142 is not limited to the example shown in the drawing and may be formed in various ways.

Figure 7A:
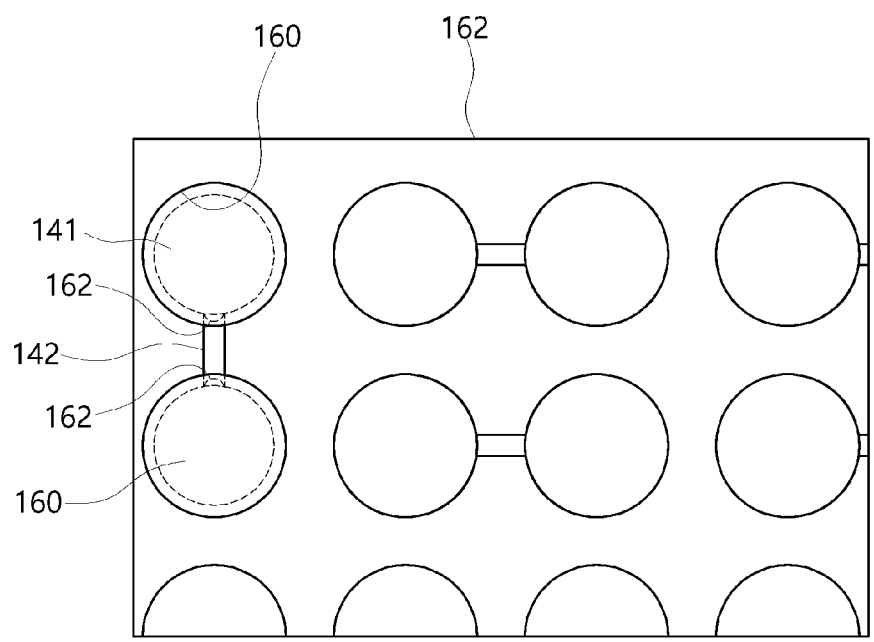
Figure 7B:
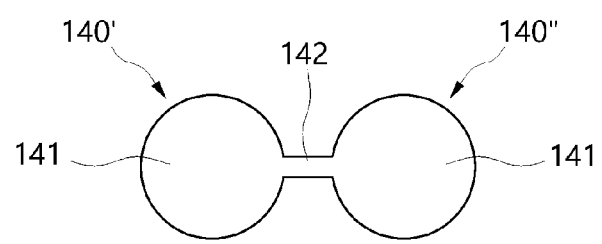
Figure 8A:
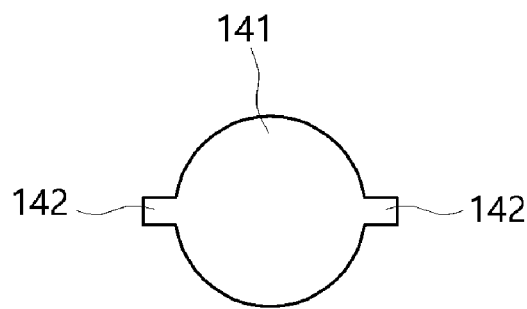
Figure 8B:
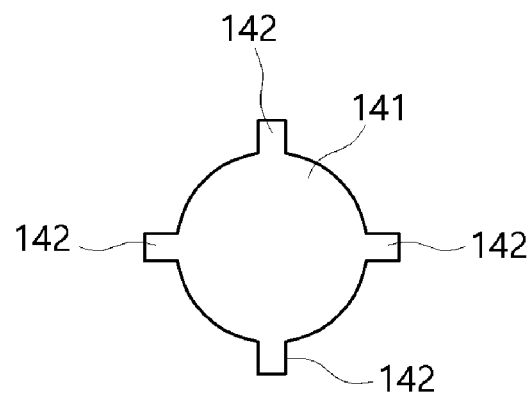
Figure 8C:
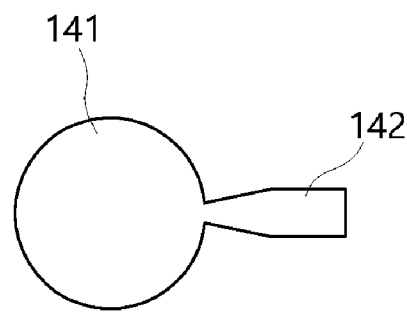
Figure 8D:
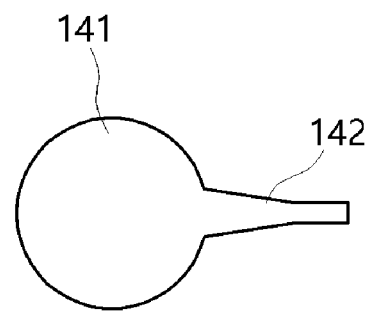

In the third embodiment of the present invention, as shown in FIGS. 7A-7B, the wiring pattern 140a may include a first wiring pattern 140a' and a second wiring pattern 140a'' connected to the first wiring pattern 140a'.

Specifically, a first inducting portion 142 of the first wiring pattern 140a' and a second inducting portion 142 of the second wiring pattern 140a'' may be connected to each other so that the overall shape may be formed like a dumbbell having a left-right symmetrical structure.

In this case, the first wiring pattern 140a' and the second wiring pattern 140a'' may be integrally formed.

In the case of introducing the first wiring pattern 140a' and the second wiring pattern 140a'' that are connected to each other and formed integrally as described above, since a plurality of wiring patterns can be formed on the semiconductor chip 110 at a time, quicker and more economical effects can be obtained in the process.

However, the above-described dumbbell-shaped wiring pattern 140a is only an example, and the first wiring pattern 140a' and the second wiring pattern 140a'' may be connected in various forms, and it should be noted that in addition to the first wiring pattern 140a' and the second wiring pattern 140a'', various connections may be made including a third wiring pattern and a fourth wiring pattern.

Figure 9:
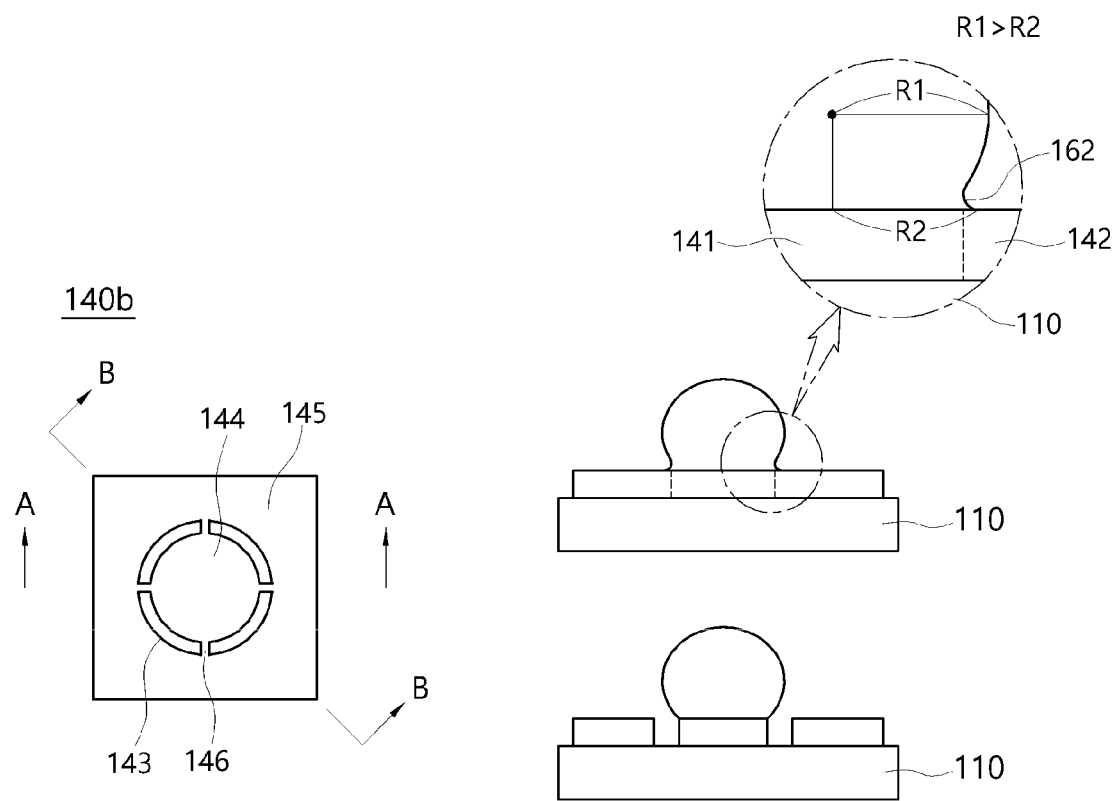
FIGS. 9 and 10A-10B are diagrams illustrating another example of a baton pattern applied to a semiconductor package according to various embodiments of the present invention.

In the third embodiment of the present invention, as another example of the wiring pattern 140, a wiring pattern 140b may be formed in the form of a pad having a predetermined area in the horizontal direction as shown in FIG. 9.

In this case, a plurality of slits 143 penetrating the wiring pattern 140b may be formed in the wiring pattern 140b. The plurality of slits 143 may be disposed to be spaced apart from each other, and may be disposed to surround a region in which the solder bump 160 and the wiring pattern 140b contact each other. That is, in the case of the spherical solder bump 160, the plurality of slits 143 may be disposed to form a circular shape as a whole so as to correspond to the lower portion of the solder bump 160 as shown in the drawing.

In this case, a passage 146 may be formed between the plurality of slits 143 disposed to be spaced apart from each other.

Meanwhile, since the plurality of slits 143 form a closed curve surrounding the solder bump 160, they may partition the wiring pattern 140b spatially. Specifically, for the pad-shaped wiring pattern 140b, the plurality of slits 143 may partition an inner space portion 144 formed inside the plurality of slits 143 and an outer space portion 145 formed outside the plurality of slits 143. Through this, the plurality of slits 143 may function to spatially isolate the solder bump 160 on the pad-shaped wiring pattern 140b.

In more detail, the solder bump 160 may be seated on the inner space portion 144, and the molten state solder bump 160 may be restricted from flowing in the horizontal direction by the plurality of slits 143. Through this, the solder bump 160 may effectively maintain a spherical shape by generating a surface tension in the inner space portion 144 of a limited area according to the same principle as described above.

In this case, as described above, a passage 146 may be formed between the plurality of slits 143, through the passage a part of the solder bump 160 may flow to form the protruding projection 162 described above. The formation of the passage 146 by disposing the plurality of slits 143 spaced apart is to form the protruding projection 162 by allowing a small amount of the solder bump 160 to flow through the passage 146 like the inducting portion 142 discussed above, thereby properly maintaining the distance between molecules in the solder bump 160. That is, the formation of the passage 146 is to prevent the solder bump 160 from flowing to the region of the slit 143 without further maintaining the spherical shape due to the repulsive force between the molecules when the distance between the molecules is insufficient.

Figure 10A:
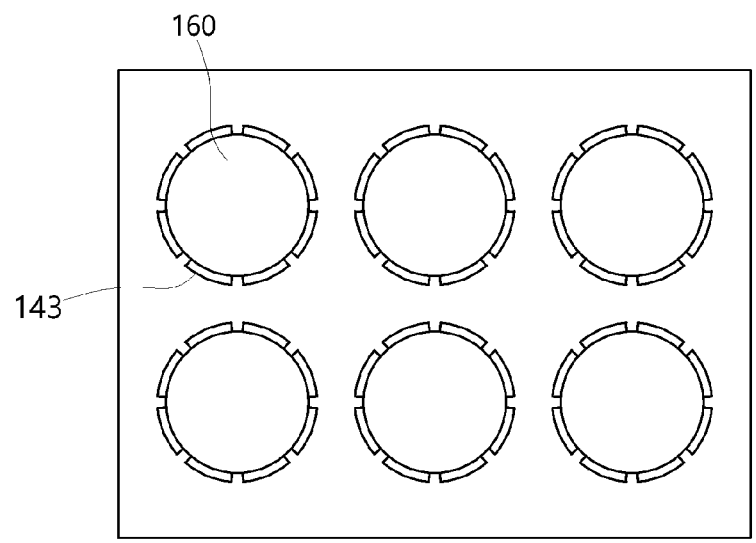
Figure 10B:
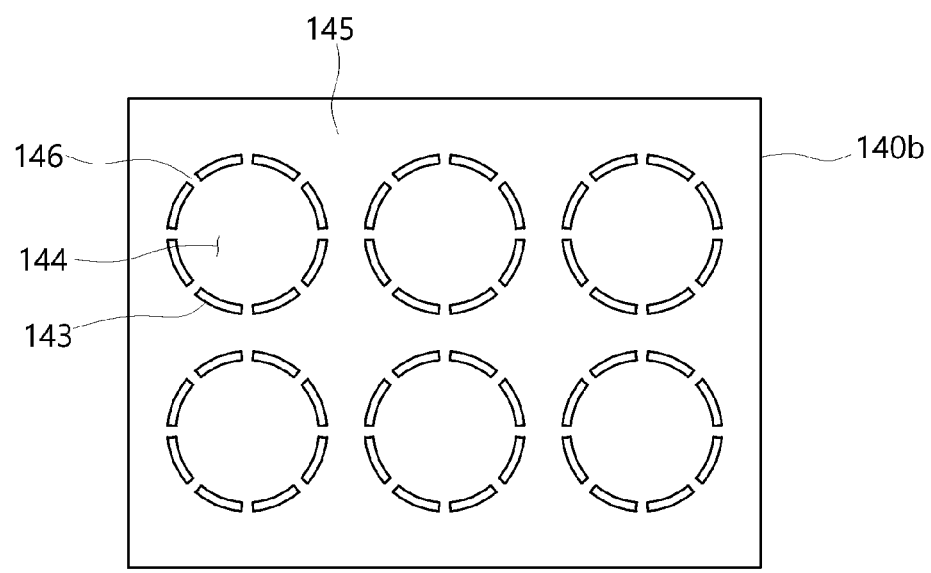

Meanwhile, referring to FIGS. 10A-10B, a plurality of solder bumps 160 may be fixed on the wiring pattern 140b formed in a pad shape. In this case, a plurality of slits 143 may be individually formed in an adjacent region of each solder bump 160 to surround the solder bump 160. As described above, a plurality of slits 143 may be formed at one time in each of the positions corresponding to the plurality of solder bumps 160 using the pad-shaped wiring pattern 140b, thereby improving process efficiency.

In the third embodiment of the present invention, the solder bump 160 may include a core ball 161 therein.

In more detail, referring to FIG. 5, the core ball 161 may be formed in a spherical shape having a diameter smaller than that of the solder bump 160, and may be disposed in the center of the solder bump 160.

In this case, the core ball 161 may be formed of plastic or copper, and by taking up a space inside the solder bump 160, it may apply pressure to the molten state solder bump 160 in an outward direction. Through this, the molten state solder bump 160 may be formed to have a closer inter-molecular distance, and form a more stable surface tension based on this, thereby effectively maintaining a spherical shape.

Meanwhile, the material of the core ball 161 is not limited to the above-described plastic or copper, and any material may be applied as long as it is a material capable of effectively generating surface tension within the solder bump 160.

In the third embodiment of the present invention, an oxide layer 150 as described in the first and second embodiments of the present invention may be formed on at least a portion of the outer surface of the wiring pattern 140 except for the portion on which the solder bump 160 is disposed.

In this case, the oxide layer 150 refers to a layer formed by chemically reacting by at least some of the materials constituting the wiring pattern 140 through a special process, and is to enhance the corrosion resistance and abrasion resistance of the wiring pattern. As a non-limiting example, as described above, the oxide layer 150 may be formed through a black oxide process. Other descriptions related to the formation of the oxide layer 150 will be omitted since they overlap with the descriptions related to the previous embodiments.

In the third embodiment of the present invention, instead of the above-described oxide layer 150, an organic solderability preservative (OSP) 170 may be formed on at least a portion of the outer surface of the wiring pattern 140 except for the portion on which the solder bump 160 is disposed.

In this case, the organic solderability preservative 170 is for coating the wiring pattern 140 by performing surface treatment, and may include an organic compound which is selectively combined with the material of the wiring pattern 140.

As an example, the organic compound forming the organic solderability preservative may be Alkylbenzimidazole, and such an organic solderability preservative may chemically react with the surface of the wiring pattern 140 to form a thin and uniform film on the surface of the wiring pattern 140. Which may effectively protect the surface of the wiring pattern 140 from external air and moisture and at the same time effectively prevent oxidation of the wiring pattern 140 even in a high humidity environment such as reflow and curing of the underfill 190 to be described later.

Hereinafter, the semiconductor package 400 according to the fourth embodiments of the present invention will be described with reference to FIG. 11. However, duplicate descriptions with the semiconductor package 300 according to the third embodiment of the present invention will be omitted.

The semiconductor package 400 according to the fourth embodiment of the present invention has a separate insulating pattern 130 between the semiconductor chip 110 and the wiring pattern 140 compared to the semiconductor package 300 according to the third embodiment of the present invention.

Figure 11:
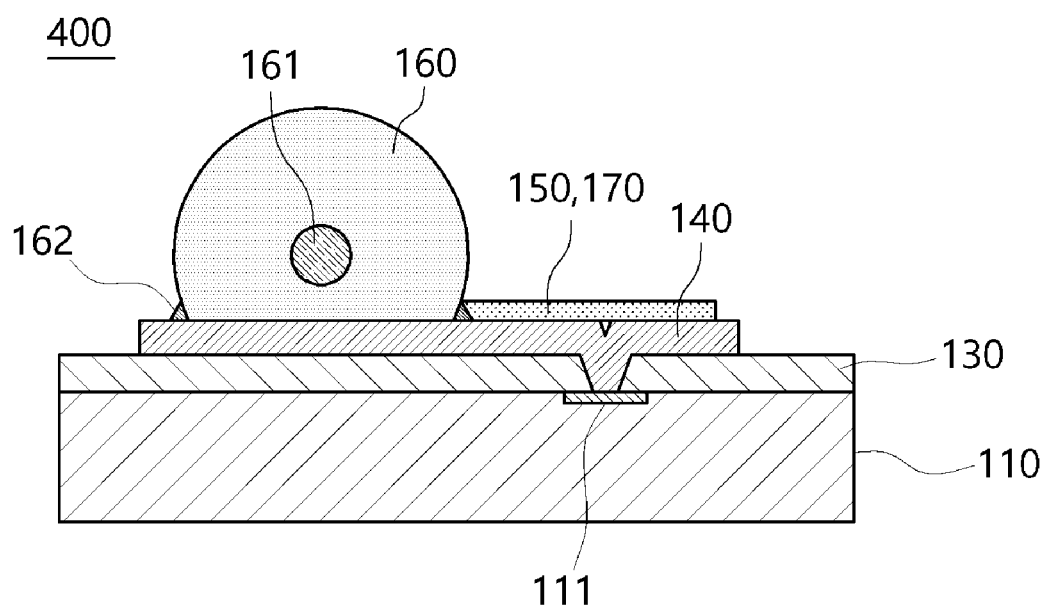
FIG. 11 is a diagram illustrating a cross-section of a semiconductor package according to a fourth exemplary embodiment of the present invention.
Figure 12A:
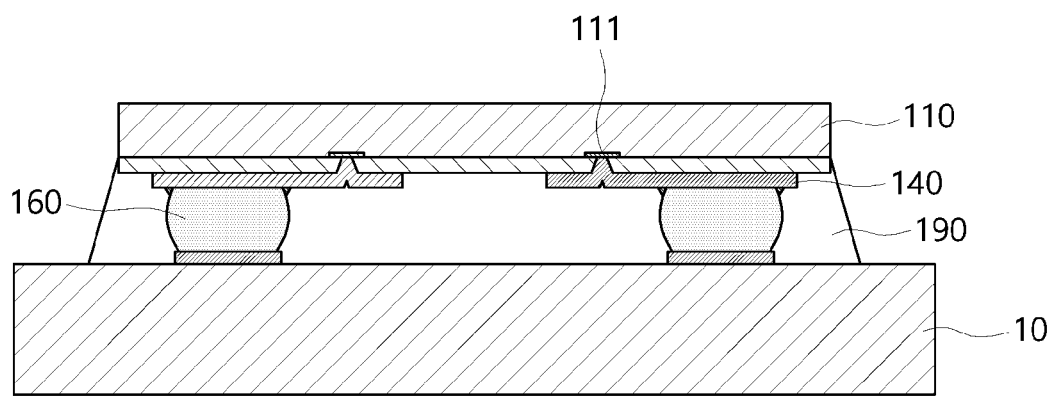
FIGS. 12A-12B are cross-sectional views illustrating a state in which a semiconductor package according to various embodiments of the present invention is mounted on a PCB substrate.
Figure 12B:
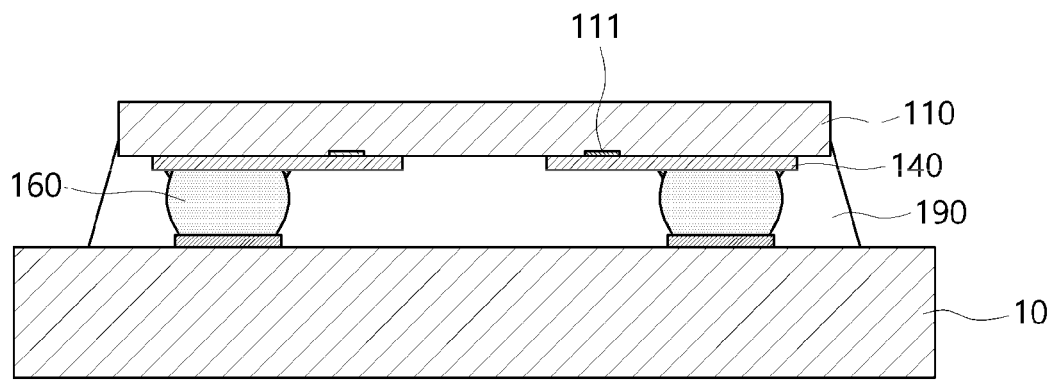

In this case, as shown in FIG. 11, the insulating pattern 130 may be disposed on top of the semiconductor chip 110 and may be disposed to expose at least a portion of the chip pad 111. In addition, the insulating pattern 130 provided on the semiconductor chip 110 may be formed of polyimide (PI), for example.

In this case, the wiring pattern 140 is disposed on top of the insulating pattern 130, and there is only a difference in that at least a portion of the wiring pattern 140 is in contact with the exposed portion of the chip pad 111 so that it is electrically connected to the chip pad 111, but the main function and structure of the wiring pattern 140 is the same as the wiring pattern 140 of the semiconductor package 300 according to the third embodiment of the present invention, so a description thereof will be omitted.

Meanwhile, the semiconductor package 100, 200, 300, 400 according to various embodiments of the present invention may be mounted on the PCB substrate 10. After the semiconductor package 100, 200, 300, 400 is mounted on the substrate 10, an underfill material 190 may be filled between the semiconductor package 100, 200, 300, and 400 and the substrate 10 to form an electrical insulating layer.

In this case, the insulating pattern 130, the wiring pattern 140, and the external connection terminal 160 of the semiconductor package 100, 200, 300, 400 may directly contact the underfill material 190 to be buried by the underfill material 190.

In this case, the underfill material 190 may be known materials, or the same material as an epoxy molding compound for molding the semiconductor chip 110 may be used.

By performing the SMT (Surface Mount Technology) process through the underfill material 190, the semiconductor package 100, 200, 300, 400 according to various embodiments of the present invention may omit the aforementioned UBM process or passivation process. This may simplify the process and reduce the cost of a semiconductor package.

As described above, the semiconductor package 100, 200, 300, 400 described above can be applied to not only wafer level packaging (WLP) but also fan-out wafer-level packaging (FOWLP); and an additional passivation process and a process for opening an external pad on the top of the wiring pattern may be replaced with the oxide layer 150 or the organic solderability preservative, or omitted.

Specifically, an example in which a semiconductor package according to various embodiments of the present invention is applied to the FOWLP process will be described with reference to FIG. 13.

Figure 13:
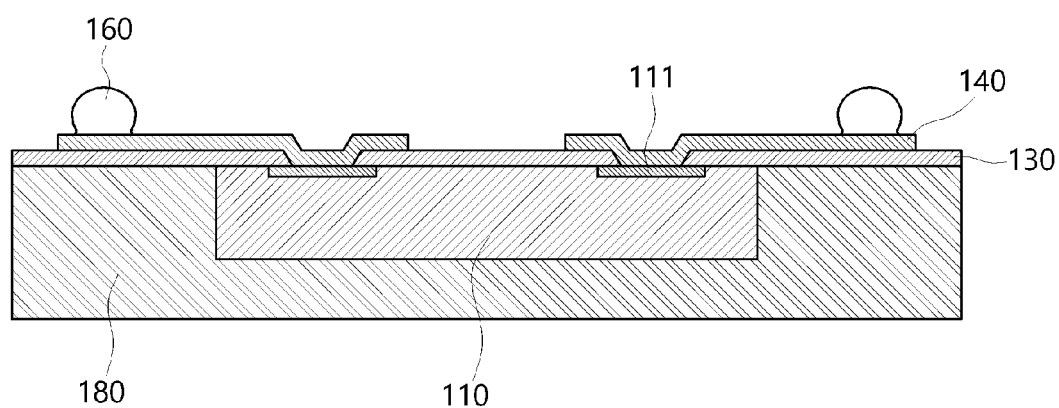
FIGS. 13 and 14 are a cross-sectional view illustrating a state in which a semiconductor package according to various embodiments of the present invention is applied to the FOWLP process.

According to the FOWLP process, as shown in FIG. 13, the semiconductor chip 110 may be covered by an encapsulation portion 180, and an insulating pattern 130 may be formed on the semiconductor chip 110 and the encapsulation portion 180. In this case, the encapsulation portion 180 is for protecting the semiconductor chip 110 from heat, moisture, or external impact, and may be, for example, the semiconductor chip 110 of an epoxy molding compound.

In addition, it is possible to remove a portion of the insulating pattern 130 positioned on the chip pad 111 of the insulating pattern 130, form a wiring pattern 140, and then place a solder bump 160 directly on the wiring pattern 140. However, in this case, it will be also possible to form the wiring pattern 140 directly on the semiconductor chip 110 and the encapsulation portion 180 and form the solder bump 160 without forming a separate insulating pattern 130 as needed.

In this case, being possible to form the solder bump 160 directly on the wiring pattern 140 without a separate UBM process is due to the wiring pattern 140 and the core ball 161 and the like formed to isolate the solder bump 140, as described above.

Figure 14:
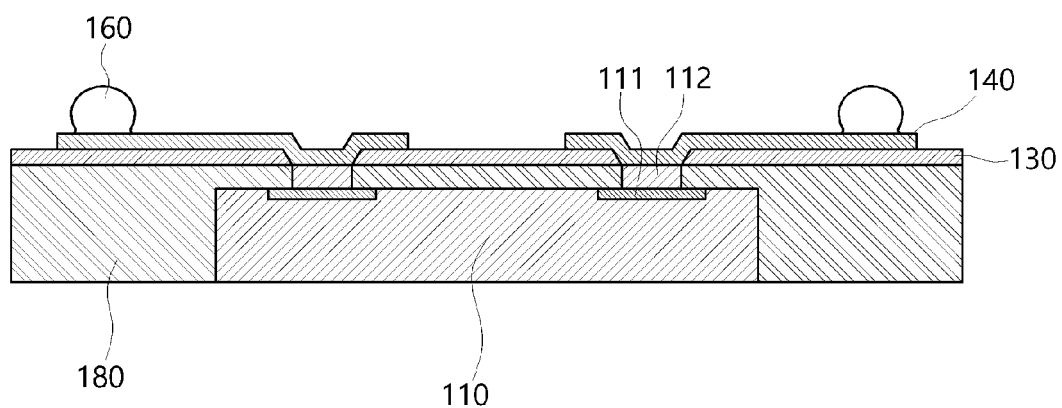

Meanwhile, according to another semiconductor packaging process, as shown in FIG. 14, a conductive pillar 112 may be formed on the semiconductor chip 110 and molded to surround it with the above-described encapsulation portion 180, and then the insulating pattern 130 may be formed. Thereafter, a region of the insulating pattern 130 corresponding to the conductive pillar 112 may be opened and the wiring pattern 140 may be formed as shown in the drawing, and then as described above, the solder bump 160 may be directly placed on the wiring pattern 140 by the wiring pattern 140 and the core ball 161 and the like formed to isolate the solder bump 140.

Hereinafter, a semiconductor package according to a fifth embodiment of the present invention will be described.

Figure 15:
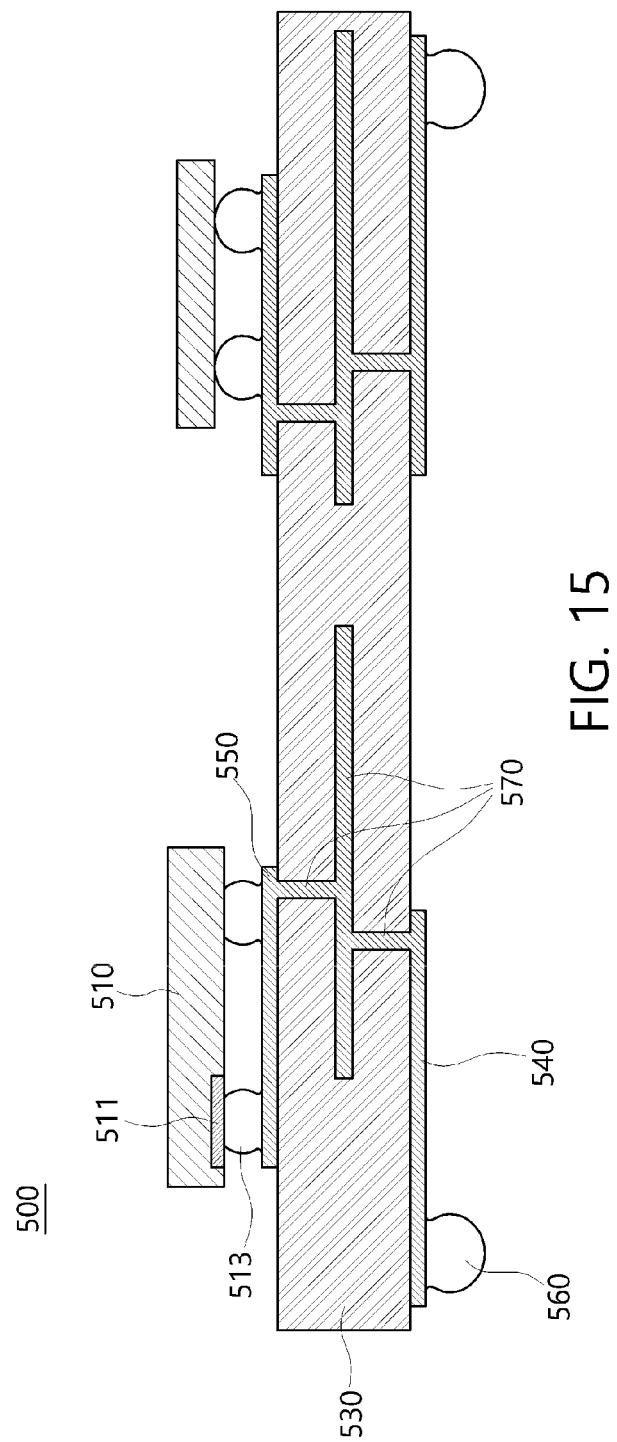
FIG. 15 is a diagram illustrating a cross-section of a semiconductor package according to a fifth exemplary embodiment of the present invention.

Referring to FIG. 15, the semiconductor package 500 according to the fifth embodiment of the present invention includes an insulating body 530, an upper wiring pattern 550, a lower wiring pattern 540, a connecting wiring pattern 570, a semiconductor chip 510, and a solder bump 560.

The insulating body 530 may be formed in a plate structure as shown in the drawing, and may be made of a dielectric constant (Dk) and dielectric tangent (Df) material. Accordingly, the semiconductor package 500 can be utilized for high-speed RF signal transmission.

In this case, the insulating body 530 may be made of an insulating polymer, an epoxy, a silicon oxide film, a silicon nitride film (SiN), or a combination thereof. Alternatively, the insulating body 530 may be made of a non-photosensitive material or a photosensitive material. For example, the insulating body 530 may be made of polyimide (PI).

Here, the insulating polymer may include a general-purpose polymer such as PMMA (Polymethylmethacrylate), PS (Polystyrene), and PBO (Polybenzoxazole), an acrylic based polymer, an imide based polymer (polyimide (PI)), an aryl ether based polymer, an amide based polymer, a fluorine based polymer, a p-xylene based polymer, a vinyl alcohol based polymer, a polymer derivative having a phenolic group, or a combination thereof.

Next, the upper wiring pattern 550 may be made of a conductive material such as, for example, W, Cu, Zr, Ti, Ta, Al, Ru, Pd, Pt, Co, Ni, or a combination thereof.

In the fifth embodiment of the present invention, the upper wiring pattern 550 may be disposed on the insulating body 530 as shown in the drawing to be electrically connected to the chip pad 511 of the semiconductor chip 510. In this case, the semiconductor chip 510 may be connected through a solder 513.

The lower wiring pattern 540 may be formed of the same material as the upper wiring pattern 550, and may be disposed on the lower surface of the insulating body 530. That is, the lower wiring pattern 540 may be disposed opposite to the upper wiring pattern 550 with respect to the insulating body 530.

In this case, the solder bump 560 may be placed on the lower wiring pattern 540 as shown in the drawing.

Specifically, similar to the above-described embodiment, the lower wiring pattern 540 may include an isolated portion having a predetermined area to limit the flow range of the solder bump 560 in a molten state, and supporting the solder bump; and an inducting portion extending horizontally from one side of the isolated portion so that the molten state solder bump flows a predetermined distance to form a protruding projection.

In this case, the structure and function of the isolated portion and the inducting portion included in the lower wiring pattern 540 are the same as the isolated portion 141 and the inducting portion 142 described in the above-described embodiment. In addition, the shape or flow of the solder bump 560 placed on the lower wiring pattern 540 is also the same as in the above-described embodiment. That is, the line width of the inducting portion may be 1% to 15% of the line width of the solder bump, and the length of the protruding projection of the solder bump protruding from the solder bump may be 0.1 um to 20 um. In addition, a core ball may be included inside the solder bump. Other duplicate descriptions will be omitted.

As described above, the lower wiring pattern 540 may make the solder bump 560 to maintain a spherical or elliptical shape as much as possible through the core ball and a unique structure including the isolated portion and the inducting portion.

Meanwhile, referring to the drawing again, the connecting wiring pattern 570 connecting the upper wiring pattern 550 and the lower wiring pattern 540 to each other may be disposed in the insulating body 530 in a form buried by the insulating body. Through this, the semiconductor chip 510 may be electrically connected to a PCB substrate to be connected to the solder bump 560 in the future.

The semiconductor package 500 according to the fifth embodiment of the present invention including the above configuration may be a system-in-package technology (SiP), and may have a multichip structure including heterogeneous semiconductor chips. That is, the semiconductor package 500 may include a plurality of semiconductor chips. In addition, the semiconductor package 500 may include a plurality of passive devices.

Although various exemplary embodiments of the present invention have been described above, the spirit of the present invention is not limited to the embodiments set forth herein. Those of ordinary skill in the art who understand the spirit of the present invention may easily propose other embodiments through supplement, change, removal, addition, etc. of elements within the same spirit, but the embodiments will be also within the scope of the present invention.

What is claimed is:

1. A semiconductor package, comprising:
   a semiconductor chip having at least one chip pad disposed on one surface of the semiconductor chip;
   a wiring pattern disposed on top of the semiconductor chip and having at least a portion of the wiring pattern in contact with the at least one chip pad to be electrically connected to the at least one chip pad; and
   a solder bump disposed on an outer surface of the wiring pattern to be electrically connected to the at least one chip pad through the wiring pattern; wherein the solder bump comprises a protruding projection on the solder bump protruding outward from the solder bump and wherein the protruding projection has a shape of a meniscus;
   wherein the wiring pattern comprises:

an isolated portion having a predetermined area to limit a flow range of the solder bump in a molten state, wherein the solder bump is disposed on the isolated portion; and an inducting portion extending horizontally from one side of the isolated portion to allow the solder bump in the molten state to flow a predetermined distance to form the protruding projection, wherein the solder bump in the molten state flows from the isolated portion to the inducting portion to form the protruding projection on the solder bump.

2. The semiconductor package of claim 1, wherein a line width of the inducting portion is 1% to 15% of a line width of the solder bump.

3. The semiconductor package of claim 1, wherein a length of the protruding projection protruding from the solder bump is 0.1 to 20 μm.

4. The semiconductor package of claim 1, wherein the solder bump comprises a core ball in a center of the solder bump.

5. The semiconductor package of claim 1, wherein the semiconductor chip is buried by an encapsulation portion in a state in which a portion of an upper surface of the semiconductor chip is open, and the wiring pattern is disposed on top of the semiconductor chip and the encapsulation portion.

6. The semiconductor package of claim 1, wherein a conductive pillar is disposed on top of the at least one chip pad, the semiconductor chip is buried by an encapsulation portion in a state in which the conductive pillar is disposed, and the wiring pattern is disposed on top of the encapsulation portion to be electrically connected to the conductive pillar.

7. The semiconductor package of claim 1, further comprising:
a PCB substrate electrically connected to an upper portion of the solder bump; and
an underfill filled to surround the wiring pattern and the solder bump in a space formed between the semiconductor chip and the PCB substrate.

8. A semiconductor package, comprising:
a semiconductor chip having at least one chip pad disposed on one surface of the semiconductor chip;
a wiring pattern disposed on top of the semiconductor chip and having at least a portion of the wiring pattern in contact with the at least one chip pad to be electrically connected to the at least one chip pad; and
a solder bump disposed on an outer surface of the wiring pattern to be electrically connected to the at least one chip pad through the wiring pattern,
an insulating pattern disposed on top of the semiconductor chip and disposed to form at least one exposed portion of the at least one chip pad,
wherein the wiring pattern is disposed on top of the insulating pattern, the at least one portion of the wiring pattern is in contact with the at least one exposed portion of the at least one chip pad to be electrically connected to the at least one chip pad, and an oxide layer generated by a chemical reaction with the material of the wiring pattern or an organic solderability preservative comprising an organic compound selectively combined with the material of the wiring pattern is formed on at least a portion of the outer surface of the wiring pattern except for a portion on which the solder bump is disposed.

9. The semiconductor package of claim 8, wherein the wiring pattern comprises:

an isolated portion having a predetermined area to limit a flow range of the solder bump in a molten state, and supporting the solder bump; and an inducting portion extending horizontally from one side of the isolated portion to allow the solder bump in the molten state to flow a predetermined distance to form a protruding projection, wherein a length of the protruding projection protruding from the solder bump is 0.1 to 20 μm.

10. The semiconductor package of claim 8, wherein the wiring pattern comprises:
an isolated portion having a predetermined area to limit a flow range of the solder bump in a molten state, and supporting the solder bump; and
an inducting portion extending horizontally from one side of the isolated portion to allow the solder bump in the molten state to flow a predetermined distance to form a protruding projection,
wherein the solder bump comprises a core ball in a center of the solder bump.

11. The semiconductor package of claim 8, wherein the wiring pattern is formed in a form of a pad, and comprises:
a plurality of slits penetrating the wiring pattern, spaced apart from each other, and disposed to surround a lower portion of the solder bump;
an inner space portion supporting the solder bump and provided inside the plurality of slits; and
an outer space portion provided outside the plurality of slits,
wherein at least one passage is formed between the plurality of slits to allow the solder bump in a molten state to flow a predetermined distance to form a protruding projection, and the sum of a line width of the at least one passage is 1% to 15% of a line width of the solder bump.

12. The semiconductor package of claim 1, further comprises an insulating pattern disposed on top of the semiconductor chip and disposed to form at least one exposed portion of the at least one chip pad,
wherein the wiring pattern is disposed on top of the insulating pattern, the at least one portion of the wiring pattern is in contact with the at least one exposed portion of the at least one chip pad to be electrically connected to the at least one chip pad, and an oxide layer or an organic solderability preservative is formed on at least a portion of the outer surface of the wiring pattern except for a portion on which the solder bump is disposed,
wherein the oxide layer is generated by a chemical reaction with the material of the wiring pattern, and the organic solderability preservative comprises an organic compound selectively combined with the material of the wiring pattern.

13. The semiconductor package of claim 1, wherein the semiconductor chip is buried by an encapsulation portion in a state in which a portion of an upper surface of the semiconductor chip is open, and the wiring pattern is disposed on top of the semiconductor chip and the encapsulation portion.

14. The semiconductor package of claim 1, wherein a conductive pillar is disposed on top of the at least one chip pad, the semiconductor chip is buried by an encapsulation portion in a state in which the conductive pillar is disposed, and the wiring pattern is disposed on top of the encapsulation portion to be electrically connected to the conductive pillar.

15. The semiconductor package of claim 7, wherein a side surface of the wiring pattern, and a portion of an upper surface of the wiring pattern excluding the outer surface of the wiring pattern contacting the solder bump are in contact with the underfill.

16. The semiconductor package of claim 7, wherein a lower side surface of the wiring pattern and at least a portion of the underfill are disposed on a same plane.

17. A semiconductor package, comprising:
an insulating body;
an upper wiring pattern disposed on the insulating body;
a lower wiring pattern disposed on a lower surface of the insulating body;
a connecting wiring pattern disposed in the insulating body and connecting the upper wiring pattern and the lower wiring pattern;
a semiconductor chip disposed on the insulating body and comprising a chip pad electrically connected to the upper wiring pattern; and
a solder bump disposed on an outer surface of the lower wiring pattern to be electrically connected to the semiconductor chip; wherein the solder bump comprises a protruding projection on the solder bump protruding outward from the solder bump and wherein the protruding protection has a shape of a meniscus;
wherein the lower wiring pattern comprises:
an isolated portion having a predetermined area to limit a flow range of the solder bump in a molten state, wherein the solder bump is disposed on the isolated portion; and
an inducting portion extending horizontally from one side of the isolated portion to allow the solder bump in the molten state to flow a predetermined distance to form the protruding projection, wherein the solder bump in the molten state flows from the isolated portion to the inducting portion to form the protruding projection on the solder bump.

18. The semiconductor package of claim 17 wherein a line width of the inducting portion is 1% to 15% of a line width of the solder bump, a length of the protruding projection protruding from the solder bump is 0.1 μm to 20 μm, and the solder bump comprises a core ball in a center of the solder bump.

19. A semiconductor package, comprising:
a semiconductor chip having at least one chip pad disposed on one surface of the semiconductor chip;
a wiring pattern disposed on top of the semiconductor chip and having at least a portion of the wiring pattern in contact with the at least one chip pad to be electrically connected to the at least one chip pad; and
a solder bump disposed on an outer surface of the wiring pattern to be electrically connected to the at least one chip pad through the wiring pattern;
wherein the wiring pattern is formed in a form of a pad and comprises:
a plurality of slits penetrating the wiring pattern, spaced apart from each other, and disposed to surround a lower portion of the solder bump;
an inner space portion supporting the solder bump and provided inside the plurality of slits; and
an outer space portion provided outside the plurality of slits,
wherein at least one passage is formed between the plurality of slits so that the molten state solder bump flows a predetermined distance to form a protruding projection, and a sum of a line width of the at least one passage is 1% to 15% of a line width of the solder bump.

20. The semiconductor package of claim 8, wherein the wiring pattern comprises:
an isolated portion having a predetermined area to limit a flow range of the solder bump in a molten state, and supporting the solder bump; and
an inducting portion extending horizontally from one side of the isolated portion to allow the solder bump in the molten state to flow a predetermined distance to form a protruding projection,
wherein a line width of the inducting portion is 1% to 15% of a line width of the solder bump.

* * * * *